United States Patent
Shearon et al.

(10) Patent No.: US 6,603,358 B2
(45) Date of Patent: Aug. 5, 2003

(54) INTEGRATED CIRCUIT WITH CURRENT-LIMITED POWER OUTPUT AND ASSOCIATED METHOD

(75) Inventors: William Shearon, Findlay, OH (US); Salomon Vulih, Neshanic Station, NJ (US); Donald Preslar, Somerville, NJ (US)

(73) Assignee: Intersil Americas Inc., Irvine, CA (US)

( * ) Notice: Subject to any disclaimer, the term of this patent is extended or adjusted under 35 U.S.C. 154(b) by 44 days.

(21) Appl. No.: 09/928,857

(22) Filed: Aug. 13, 2001

(65) Prior Publication Data

US 2002/0024386 A1 Feb. 28, 2002

Related U.S. Application Data

(60) Provisional application No. 60/227,566, filed on Aug. 23, 2000.

(51) Int. Cl.[7] .................................................. H03F 3/04
(52) U.S. Cl. ...................... 330/288; 330/298; 330/300
(58) Field of Search ................................ 330/288, 298, 330/300

(56) References Cited

U.S. PATENT DOCUMENTS

| | | | | |
|---|---|---|---|---|
| 3,967,207 A | * | 6/1976 | Wheatley, Jr. .............. | 330/309 |
| 5,164,679 A | * | 11/1992 | Dittmer ....................... | 330/298 |
| 5,272,392 A | * | 12/1993 | Wong et al. ................. | 327/109 |
| 5,404,053 A | * | 4/1995 | Poma et al. ................. | 327/108 |
| 5,497,125 A | * | 3/1996 | Royds ......................... | 330/290 |
| 5,578,956 A | * | 11/1996 | Rossi et al. ................. | 327/309 |
| 5,923,217 A | * | 7/1999 | Durec ......................... | 330/288 |
| 5,969,574 A | * | 10/1999 | Legates ....................... | 330/288 |

FOREIGN PATENT DOCUMENTS

EP    0 574 646    12/1993    .......... H03K/17/06

* cited by examiner

*Primary Examiner*—Michael Tokar
*Assistant Examiner*—Khai Nguyen
(74) *Attorney, Agent, or Firm*—Allen, Dyer, Doppelt, Milbrath & Gilchrist, P.A.

(57) ABSTRACT

The integrated circuit includes a power FET for generating an output voltage, a pilot FET for sensing current through the power driving device and generating a reference voltage, and an amplifier circuit for comparing the reference voltage of the pilot device with the output voltage of the power driving device. The amplifier circuit includes a differential pair of matched bipolar junction transistors (BJTs) having a common base. A first BJT of the differential pair being diode-connected. The amplifier circuit controls the gates of the power FET and the pilot FET.

21 Claims, 2 Drawing Sheets

INTEGRATED CIRCUIT WITH CURRENT-LIMITED POWER OUTPUT AND ASSOCIATED METHOD

RELATED APPLICATION

This application is based upon prior filed provisional application No. 60/227,566 filed Aug. 23, 2000, the entire disclosure of which is incorporated herein by reference.

FIELD OF THE INVENTION

The present invention relates to integrated circuits, and more particularly, to a pilot-sensor style power output of an integrated circuit.

BACKGROUND OF THE INVENTION

Often, a high-power output from an integrated circuit (IC) must have a fail-safe current limiting function built-in to the device to prevent damage either to the IC or the load which it must drive. There are two conventional methods to sense the current through the IC driver output. The simpler method uses an explicit or parasitic resistance in the current path. This resistance, which must be predictable, causes a voltage drop which can be compared to a reference voltage. This voltage drop across the sense resistance is usually undesirable because it reduces the output voltage swing and generates on-chip power waste.

The second method introduces no series voltage drop in the output path, but instead builds a parallel, sense field effect transistor (FET), also known as a pilot device, which runs at a known reference current level. This pilot device is matched exactly to the driver, except the pilot device is scaled down significantly in size and in current from the driver. In this way, the pilot and the driver will be running the same current densities at the trip-point for the limiter (the maximum driver current).

U.S. Pat. No. 4,553,084 to Wrathall describes a current sensing circuit incorporating a pilot sense transistor having a sensing resistor in its source leg. The pilot sense transistor is a portion of a large switching transistor and so variations in the large switching transistor can be accurately tracked by the pilot sense transistor. An operational amplifier monitors the signal provided by the sensing resistor for providing feedback information to a driver circuit. Wrathall describes another apparatus for sensing load current in U.S. Pat. No. 4,820,968 which uses a sense resistor in the leg of a current mirroring transistor to convert a mirrored current into a voltage. This voltage is then compared to a reference voltage generated by a reference current which is a equal to a portion of the load current.

In a conventional integrated circuit with a pilot-sensor style power output, an amplifier/comparator would typically be provided for comparing the output voltage of the driver with the reference current from the pilot device. Typical approaches are complex, include transistor offset errors, and consume too much power.

SUMMARY OF THE INVENTION

In view of the foregoing background, it is therefore an object of the invention to provide current limiting in a power driving device of an integrated circuit with reduced offset errors and reduced power consumption.

This and other objects, features and advantages in accordance with the present invention are provided by an integrated circuit including a power driving device for generating an output voltage, a pilot device for sensing current through the power driving device and generating a reference voltage, and an amplifier circuit for comparing the reference voltage of the pilot device with the output voltage of the power driving device. The amplifier circuit includes a differential pair of bipolar junction transistors (BJTs) having a common base.

A first BJT of the differential pair may be diode-connected. Furthermore, the power driving device is preferably a power field effect transistor (FET), and the pilot device is preferably a sense FET scaled and matched to the power FET. The amplifier circuit may also include a first current source connected to a collector of a first BJT of the differential pair, and a second current source connected to a collector of a second BJT of the differential pair. Also, a pilot current source may be connected to a source of the sense FET, and a current sink may be connected in parallel with the pilot current source to subtract a bias current run through the first BJT from the first current source.

Also, an emitter of the first BJT may be connected to the source of the sense FET, and an emitter of the second BJT may be connected to a source of the power FET. The collector of the second BJT is connected to the gates of the sense FET and power FET, and the amplifier circuit generates a control signal for the power driving device and the pilot device.

Objects, features and advantages in accordance with the present invention are provided by a method of limiting the current in a power driving device of an integrated circuit. The method including sensing current through the power driving device with a pilot device and generating a reference voltage, and comparing the reference voltage with an output voltage of the power driving device with an amplifier circuit comprising a differential pair of bipolar junction transistors (BJTs) having a common base. A control signal is generated for the power driving device and the pilot device based upon the comparison of the reference voltage and the output voltage.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
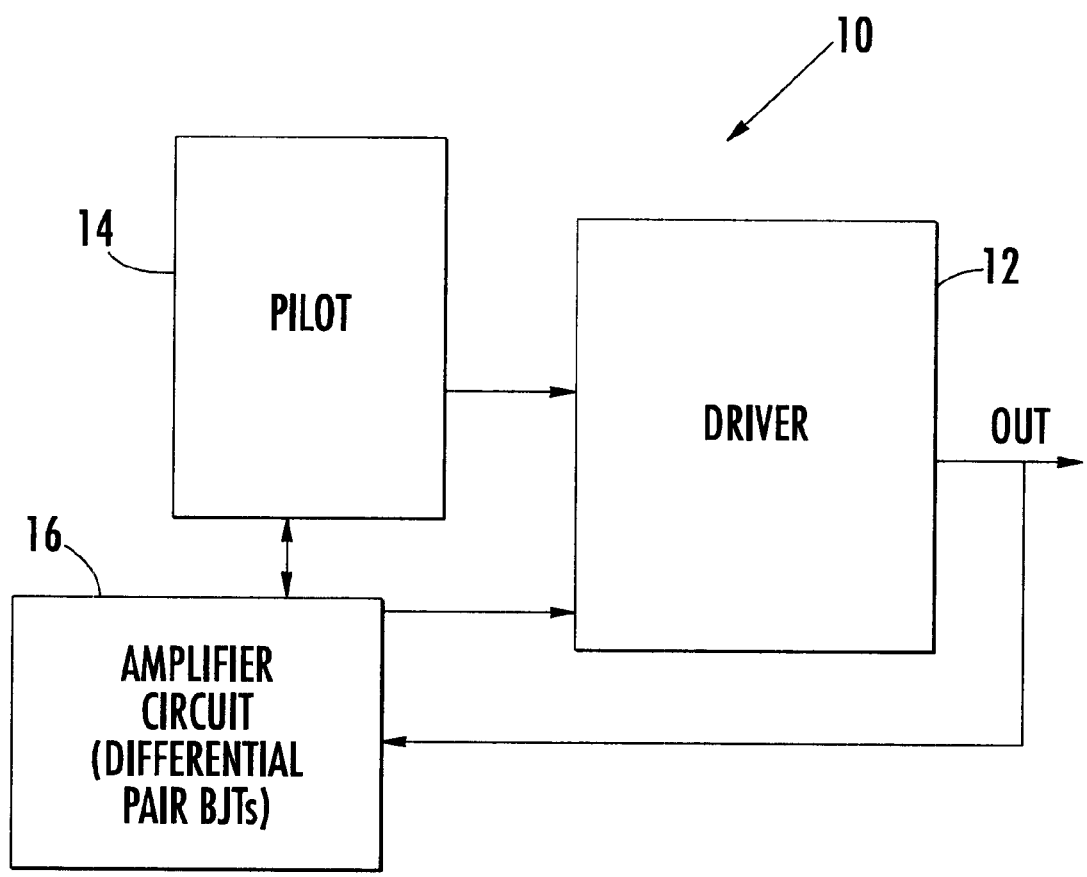
FIG. 1 is a schematic block diagram of an integrated circuit according to the present invention.

Referring to FIG. 1, an integrated circuit (IC) 10 in accordance with the present invention will now be described. The IC 10 may be the output stage for a high side driver (NFET) hot-plug product disclosed in the copending provisional application No. 60/227,566 filed Aug. 23, 2000 and/or for the dual power supply controller ISL6118 disclosed in the corresponding Data Sheet published May 2001, and each of which is manufactured by Intersil Inc. of Palm Bay, Fla., the entire disclosures of which are incorporated herein by reference. The IC 10 includes a driver 12 providing a high power output that requires a current limiting function built in to the device to prevent damage to either the IC or the load which it drives.

Accordingly, the IC 10 includes a pilot device 14 which is a scaled down version of the driver 12, as would be appreciated by the skilled artisan. The pilot device 14 is scaled down significantly in size and in current but is matched exactly to the driver 12. The pilot passes a known amount of current and develops a reference voltage which is compared to the output voltage of the larger driver 12. The IC 10 also includes an amplifier circuit 16 for performing the comparison and controlling the pilot device 14 and driver 12.

In a conventional integrated circuit with a pilot-sensor style power output, an amplifier/comparator would typically be provided for comparing the output voltage of the driver with the reference current from the pilot device. Typical approaches are relatively complex, include transistor offset errors, and consume too much power.

Figure 2:
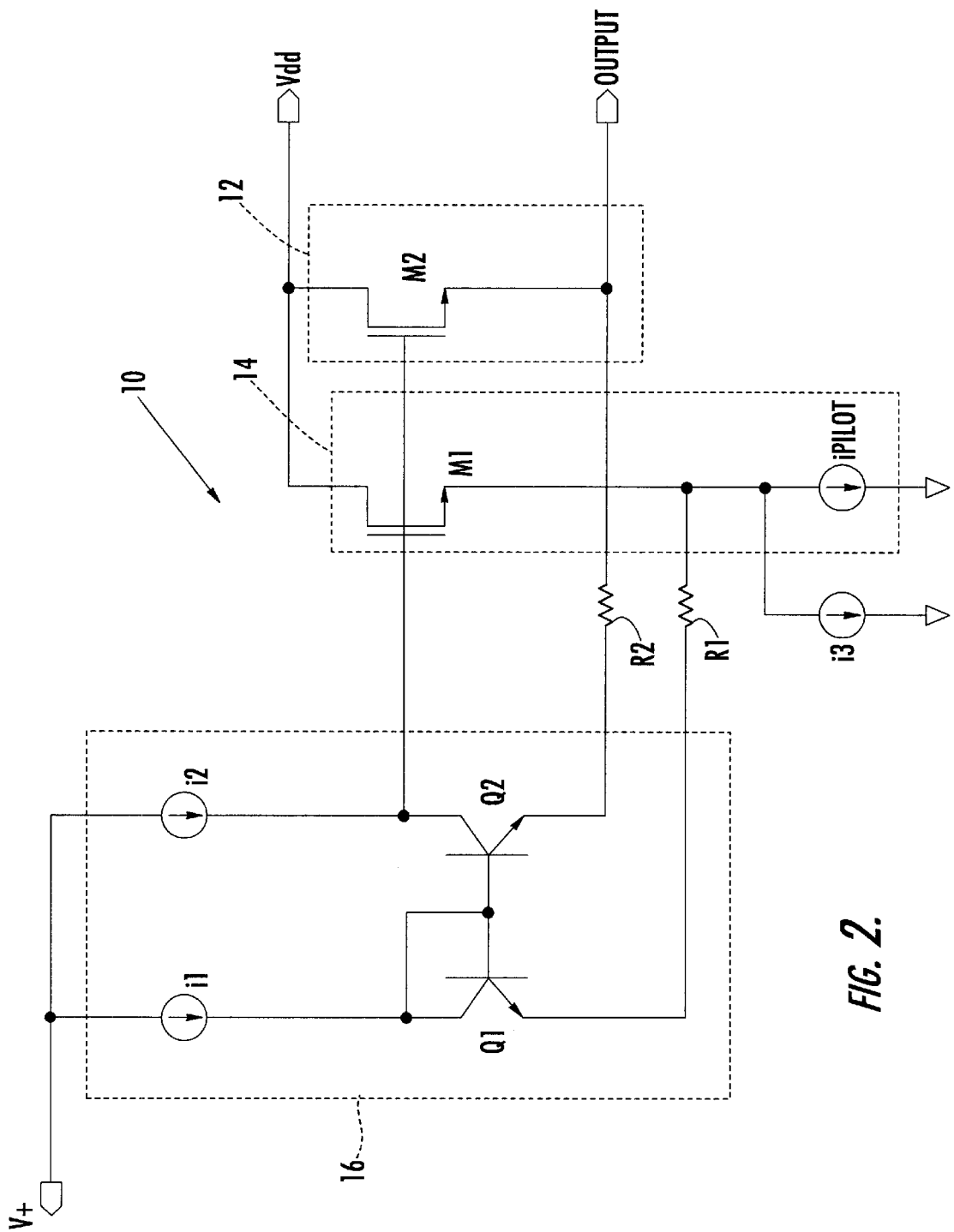
FIG. 2 is a schematic diagram illustrating an embodiment of the integrated circuit of FIG. 1.

While referring to FIG. 2, an embodiment of the IC 10 with an amplifier circuit 16 that has reduced complexity, reduced offset errors and reduced power consumption will now be described. In this embodiment, the IC 10 includes a power field effect transistor (FET) M2 as the driver 12. Also, a sense FET M1 which is scaled down significantly in size and in current but is matched exactly to the power FET M2 is included as the pilot device 14. The drains of both the power FET M2 and the sense FET M1 are connected to supply voltage Vdd. A pilot current source ipilot is connected between the source of the sense FET M1 and ground.

The amplifier circuit 16 is formed of a differential pair of matched bipolar junction transistors (BJTs) Q1 and Q2 with a common base. Also, the first BJT Q1 is diode-connected with its emitter connected to the source of the sense FET M1 via a resistor R1. The emitter of the second BJT Q2 is connected to the source of the power FET M2 via resistor R2. Current sources i1 and i2 are connected between voltage supply rail V+ and the respective collectors of the first and second BJTs Q1 and Q2. A current sink i3 is connected in parallel with the pilot current source ipilot for subtracting the bias current run through the first BJT Q1.

Moreover, the collector of the second BJT Q2 is connected to the gates of the sense and power FETs M1 and M2. The first BJT Q1 senses the reference voltage generated by the sense FET M1 of the pilot device 14 while the second BJT Q2 senses the output voltage, or source voltage, of the power FET M2 and drives the gates of the sense FET M1 and power FET M2. The non-inverting input of the amplifier circuit 16, which is the output of the driver 12, is externally perturbed. An over current detector may also be provided as part of the control circuit 16.

A feature of this IC 10 is the relatively small amount of current (e.g. 1 $\mu$A) used from the V+ supply rail. In this embodiment, the V+ supply rail is a very high-impedance charge pumped voltage rail. The currents of i1, i2 and i3 are equal and biased to only a fraction of a microamp, e.g. ¼ $\mu$A. Furthermore, the amplifier/comparator control circuit 16 has very low offset error due to the use of the BJTs Q1 and Q2 which provide the best matching presently available. Also, the driver 12 is regulated nearly to the ground rail because the differential pair Q1 and Q2 are effectively level-shifted up, but Q2 saturation is a lower voltage than the voltage (Vt) of the power FET M2 running high current.

Simulations show that an implementation of this IC 10 provides 71 dB open-loop gain, settles from step response in under 200 $\mu$s, and consumes 1 $\mu$A of V+ current. The current provided by ipilot was 10 $\mu$A in the simulations. This current could be made arbitrarily small at the penalty of pilot sense FET M1 accuracy. A compensation capacitor was not necessary in the IC 10 because the parasitic capacitances of the power FET M2 were so large.

Thus, the IC 10 with an amplifier circuit 16 has reduced complexity, reduced offset errors due to the matching of the BJTs Q1 and Q2 and reduced power consumption as discussed above.

A method of limiting the current in the power driving device 12 of an integrated circuit 10 includes sensing current through the power driving device with a pilot device 14 and generating a reference voltage, and comparing the reference voltage with an output voltage of the power driving device with an amplifier circuit 16 comprising a differential pair of bipolar junction transistors (BJTs) Q1 and Q2 having a common base. A control signal is generated for the power driving device 12 and the pilot device 14 based upon the comparison of the reference voltage and the output voltage.

The method may also include connecting a first current source i1 to a collector of a first BJT Q1 of the differential pair, connecting a second current source i2 to a collector of a second BJT Q2 of the differential pair, and connecting a pilot current source ipilot to a source of the sense FET M1. Also, a current sink i3 may be connected in parallel with the pilot current source ipilot to subtract a bias current run through the first BJT Q1 from the first current source i3. Furthermore, the method may include connecting an emitter of the first BJT Q1 to the source of the sense FET M1, connecting an emitter of the second BJT Q2 to a source of the power FET M2, and connecting the collector of the second BJT to the gates of the sense FET and power FET.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An integrated circuit comprising:
    a power driving device for generating an output voltage;
    a pilot device for sensing current through the power driving device and generating a reference voltage; and
    an amplifier circuit for comparing the reference voltage of the pilot device with the output voltage of the power driving device, and comprising a differential pair of bipolar junction transistors (BJTs) having a common base.

2. An integrated circuit according to claim 1 wherein a first BJT of the differential pair comprises a diode-connected BJT.

3. An integrated circuit according to claim 1 wherein the power driving device comprises a power field effect transistor (FET); and wherein the pilot device comprises a sense FET scaled and matched to the power FET.

4. An integrated circuit according to claim 3 further comprising:
    a first current source connected to a collector of a first BJT of the differential pair;
    a second current source connected to a collector of a second BJT of the differential pair; and
    a pilot current source connected to a source of the sense FET.

5. An integrated circuit according to claim 4 further comprising a current sink connected in parallel with the pilot current source to subtract a bias current through the first BJT from the first current source.

6. An integrated circuit according to claim 4 wherein an emitter of the first BJT is connected to the source of the sense FET, and an emitter of the second BJT is connected to a source of the power FET.

7. An integrated circuit according to claim 4 wherein the collector of the second BJT is connected to the gates of the sense FET and power FET.

8. An integrated circuit according to claim 1 wherein the amplifier circuit generates a control signal for the power driving device and the pilot device.

9. An integrated circuit comprising:
   a power FET for generating an output voltage;
   a pilot FET for sensing current through the power FET and generating a reference voltage; and
   an amplifier circuit for comparing the reference voltage of the pilot FET with the output voltage of the power FET, and comprising a differential pair of matched bipolar junction transistors (BJTs) having a common control terminal, a first BJT of the differential pair being diode-connected.

10. An integrated circuit according to claim 9 further comprising:
    a first current source connected to a first conductive terminal of the first BJT; and
    a second current source connected to a first conductive terminal of a second BJT of the differential pair.

11. An integrated circuit according to claim 10 further comprising:
    a pilot current source connected to a source of the pilot FET; and
    a current sink connected in parallel with the pilot current source to subtract a bias current through the first BJT from the first current source.

12. An integrated circuit according to claim 9 wherein a second control terminal of the first BJT is connected to the source of a sense FET, and a second control terminal of a second BJT of the differential pair is connected to a source of the power FET.

13. An integrated circuit according to claim 12 wherein the second control terminal of the second BJT is connected to the gates of the sense FET and power FET.

14. An integrated circuit according to claim 9 wherein the amplifier circuit controls the gates of the power FET and the pilot FET.

15. A method of limiting the current in a power driving device of an integrated circuit, the method comprising:
    sensing current through the power driving device with a pilot device and generating a reference voltage;
    comparing the reference voltage with an output voltage of the power driving device with an amplifier circuit comprising a differential pair of bipolar junction transistors (BJTs) having a common base; and
    generating a control signal for the power driving device and the pilot device based upon the comparison of the reference voltage and the output voltage.

16. A method according to claim 15 wherein a first BJT of the differential pair comprises a diode-connected BJT.

17. A method according to claim 15 wherein the power driving device comprises a power field effect transistor (FET); and wherein the pilot device comprises a sense FET scaled and matched to the power FET.

18. A method according to claim 17 further comprising:
    connecting a first current source to a collector of a first BJT of the differential pair;
    connecting a second current source to a collector of a second BJT of the differential pair; and
    connecting a pilot current source to a source of the sense FET.

19. A method according to claim 18 further comprising connecting a current sink in parallel with the pilot current source to subtract a bias current through the first BJT from the first current source.

20. A method according to claim 18 further comprising:
    connecting an emitter of the first BJT to the source of the sense FET; and
    connecting an emitter of the second BJT to a source of the power FET.

21. A method according to claim 18 further comprising connecting the collector of the second BJT to the gates of the sense FET and power FET.

* * * * *